United States Patent
Lee

(10) Patent No.: US 6,356,599 B1
(45) Date of Patent: Mar. 12, 2002

(54) AFC DEVICE AND METHOD OF CONTROLLING RECEPTION FREQUENCY IN A DUAL-MODE TERMINAL

(75) Inventor: Hyun-Kyu Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/389,287

(22) Filed: Sep. 2, 1999

(30) Foreign Application Priority Data

Sep. 2, 1998 (KR) ............................................ 98-36023

(51) Int. Cl.[7] ................................................. H03D 3/24
(52) U.S. Cl. ........................ 375/327; 375/344; 375/371; 455/182.2; 455/192.2; 455/190.1; 329/307; 329/324; 329/325; 329/359; 329/360
(58) Field of Search ................................ 375/340, 344, 375/354, 355, 371, 316, 324, 326, 327; 455/182.1, 182.2, 192.1, 192.2, 190.1; 329/307, 324, 325, 359, 360, 361

(56) References Cited

U.S. PATENT DOCUMENTS

| | | | |
|---|---|---|---|
| 5,163,159 A | * 11/1992 | Rich et al. | ..................... 455/74 |
| 5,982,819 A | 11/1999 | Wamack et al. | ............. 375/316 |
| 6,069,923 A | * 5/2000 | Ostman et al. | ............. 375/316 |
| 6,072,996 A | 6/2000 | Smith | ....................... 455/189.1 |
| 6,125,266 A | * 9/2000 | Matero et al. | ............. 455/126 |

* cited by examiner

Primary Examiner—Stephen Chin
Assistant Examiner—Dac V. Ha
(74) Attorney, Agent, or Firm—Dilworth & Barrese, LLP

(57) ABSTRACT

An AFC (Automatic Frequency Control) device and a method of controlling reception frequency in a dual-mode terminal. When a dual-mode terminal uses one or two AFC devices, the time required for acquiring tracking synchronization in a PLL circuit for a first frequency can be reduced using a test augmentation frequency which is an integer multiple of a tracking synchronization acquiring residual frequency of a PLL circuit for a second frequency to which the first frequency transitions for reliable synchronization acquisition. Errors with respect to an output dynamic range caused by use of two AFCs are reduced and thus the demodulation performance of a receiver is ensured by varying quantization bits of an A/D clock based on the dynamic range of residual errors in a frequency area. The demodulation performance can also be ensured by operating an ACPE circuit for an AFC device having many residual frequency errors. In this method, the frequency characteristics of the dual-mode terminal are stabilized and the stability of a demodulator is increased due to a frequency offset. As a result, stable demodulator performance is ensured.

8 Claims, 6 Drawing Sheets

AFC DEVICE AND METHOD OF CONTROLLING RECEPTION FREQUENCY IN A DUAL-MODE TERMINAL

PRIORITY

This application claims priority to an application entitled "AFC Circuit and Method Thereof in Dual-Mode Terminal" filed in the Korean Industrial Property Office on Sep. 2, 1998 and assigned Ser. No. 98-36023, the contents of which are hereby incorporated by reference.

BACKGROUND OF THE INVENTION

1. Field of the Invention

The present invention relates generally to a device and method for controlling the reception frequencies in a terminal in a mobile communication system, and in particular, to a AFC (Automatic Frequency Control) device and method of a dual-mode terminal.

2. Description of the Related Art

Data is generally transmitted by a terminal in a mobile communication system in an FDD (Frequency Division Duplexer) scheme or a TDD (Time Division Duplexer) scheme. The next-generation mobile communication system considers implementing a dual-mode terminal with the advantages of the two schemes. Since the dual-mode terminal uses different frequency bands, it requires oscillators for generating the different frequencies and thus the design of an AFC (Automatic Frequency Controller) for the oscillators is increasingly important. It is difficult to apply different feed-back loops to the two oscillators in a conventional terminal during a synchronization acquisition of different frequencies.

FIG. 1 is a block diagram of an AFC device in a receiver of a dual-mode terminal. Referring to FIG. 1, a mixer 111 mixes an input signal RX with an oscillation frequency received from a first voltage-controlled oscillator (VCO1) 119 and outputs a first mixed signal Fc1. A low-pass filter (LPF) 113 low-pass filters the output of the mixer 111. The output of the LPF 113 is the amplitude A1 of the input signal. An analog-to-digital (A/D) converter 115 converts the output of the LPF 113 to digital data q_a bits. A mixer 131 mixes the input signal RX with an oscillation frequency received from a second voltage-controlled oscillator (VCO2) 139 and outputs a second mixed signal Fc2. A LPF 133 low-pass filters the signal received from the mixer 131. The output of the LPF 133 is the amplitude A2 of the input signal. An A/D converter 135 converts the output of the LPF 133 to digital data q_b bits.

An AFC 151 receives the digital data from the A/D converters 115 and 135 and generates a signal (RX main clock) for automatically controlling a reception frequency. A TCXO (Temperature Compensated Crystal Oscillator) 153 multiplies the output of the AFC 151 to generate an intended RF (Radio Frequency)/IF (Intermediate Frequency). A Phase Locked Loop (PLL1) 117 generates a control signal for generating a phase-locked frequency according to the multiplied signal received from the TCXO 153. The oscillator VCO1 119 generates the frequency set under the control of the PLL1 117 and applies the frequency to the mixer 111. PLL2 137 generates a control signal for generating a phase-locked frequency according to the multiplied signal received from the TCXO 153. The oscillator VCO2 139 generates the frequency set under the control of the PLL2 137 and applies the frequency to the mixer 131. A Base Band Analog (BBA) circuit 155 generates a sampling clock for the A/D converter 115 in response to the output of the TCXO 153. A BBA circuit 157 generates a sampling clock for the A/D converter 135 in response to the output of the TCXO 153.

The oscillators generate different frequencies through the PLLs in the receiving AFC device of the dual-mode terminal as constructed above.

Application of the above conventional AFC device to a dual-mode transmission scheme has the following problems. The dual-mode terminal has different RFs/IFs and employs the AFC device to stabilize each oscillator when a mode transitions to a different frequency band. Here, the AFC device operates to acquire a frequency offset. To do so, it operates a feed-back loop within the range of the amount of residual frequency jitter enough to ensure the demodulation performance at the receiving end, to thereby achieve stable performance. However, it takes a long time to establish a stabilized path by operating the feed-back loop at a mode transition, resulting in the increase of time required to ensure the demodulation performance. As shown in FIG. 1, in the case that different IFs/RFs should be multiplied by one TCXO and controlled by different PLLs, a different control dynamic range is set for each loop. Therefore, the amount of jitter in the phase noise error of each VCO output is different when controlling two different VCOs, thereby decreasing the demodulation performance of the receiver.

FIG. 2 is a graph illustrating the unequal dynamic range characteristics of the receiving AFC device in the dual-mode terminal. Referring to FIG. 2, reference numerals 222 and 224 denote two frequency slopes F1_step/V_step and F2step/V_step of the TCXO 153. Reference numerals 226 and 228 denote the dynamic ranges of the first and second mixed signals Fc1 and Fc2, respectively. Reference numeral 230 denotes the phase-noise margin of the frequencies output from the TCXO 153. As shown in FIG. 2, due to use of the TCXO 153 in the AFC device of the conventional dual-mode terminal, the AFC 151 has different control voltage to frequency transform dynamic ranges. Hence, a TCXO that exhibits different slopes, as shown in FIG. 2, is required but difficult to design.

As described above, the receiving AFC device of the conventional dual-mode terminal has the problem that either a different operation should be executed at each mode or the frequency error tracking time is extended by use of a single AFC device. Another problem is that in the case of using one TCXO having a reference frequency for controlling two RFs/IFs, the dynamic ranges of the phase noise output with respect to the outputs of the two VCOs are different because of the residual phase noise of the TCXO, thereby decreasing the demodulation performance at the receiving end.

SUMMARY OF THE INVENTION

It is, therefore, an object of the present invention to provide an automatic frequency control device and method of controlling reception frequency in a dual-mode terminal, which can stabilize frequency characteristics to increase demodulation performance.

It is another object of the present invention to provide an automatic frequency control device and method of controlling reception frequency in a dual-mode terminal, which can vary the quantization level of digitized data to improve linear frequency transform characteristics.

It is a further object of the present invention to provide an automatic frequency control device and method of controlling reception frequency in a dual-mode terminal, which introduces a forward common phase error compensation scheme to increase demodulation performance.

To achieve the above and other objects, there is provided an AFC device in a dual-mode terminal. According to one embodiment of the present invention, the AFC device includes a first IF generator having a first frequency oscillator, for generating a first IF by mixing a first input signal with a first oscillation frequency. In the AFC device, a first A/D converter receives a first quantization step value, allocates quantization bits to obtain a first linear characteristic, and then converts the first IF to digital data. A second IF generator has a second frequency oscillator, and generates a second IF by mixing a second input signal with a second oscillation frequency. A second A/D converter receives a second quantization step value, allocates quantization bits to obtain a second linear characteristic, and then converts the second IF to digital data. An automatic frequency controller (AFC) receives the first and second digital data and automatically controls the frequency of a main clock based on the linear characteristics of the two input signals. A multiplier multiplies the clock and applies the multiplied clock to the first and second frequency oscillators.

According to another embodiment of the present invention, the AFC device includes a first IF generator having a first frequency oscillator, for generating a first IF by mixing a first input signal with a first oscillation frequency. A first A/D converter converts the first IF to digital data, a second IF generator has a second frequency oscillator, for generating a second IF by mixing a second input signal with a second oscillation frequency, and a second A/D converter converts the second IF to digital data. An AFC receives the first and second digital data and automatically controls the frequency of the main clock based on the linear characteristics of the two input signals. A first frequency monitor monitors the frequency of the first input signal. A multiplier receives a clock signal and the outputs of the first frequency monitor and the AFC, multiplies the clock signal, and applies the multiplied clock signal to the first and second frequency oscillators. A Phase Density Spectrum (PDS) monitor receives the first IF and PDS information of the multiplier, and generates a PDS monitoring signal. A phase error estimator estimates the phase error from the outputs of the second A/D converter and the PDS monitor, and a multiplier multiplies the phase error by the output of the second A/D converter to thereby correct the phase error.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

Preferred embodiments of the present invention will be described hereinbelow with reference to the accompanying drawings. In the following description, well-known functions or constructions are not described in detail since they would obscure the invention in unnecessary detail.

In the following description, the first and second input signals are indicated by RX1 and RX2, respectively, first and second IFs are indicated by Fc1 and Fc2, respectively, and first and second quantization steps are indicated by F1_step/V_step and F2_step/V_step, respectively.

In a dual-mode terminal using an AFC device and a TCXO which can support a dual mode, the AFC device and the TCXO generate errors due to different linear characteristics. The dual-mode terminal reduces the IF errors caused by the different linear characteristics in the two modes by reducing the time required for acquiring tracking synchronization of a PLL circuit in a mode using a first frequency by use of a test augmentation frequency which is an integer multiple of a tracking synchronization acquiring residual frequency of a PLL circuit for a second frequency to which the first frequency transitions for reliable synchronization acquisition, so that demodulation performance is ensured. Otherwise, errors with respect to a dynamic range, caused by the different linear characteristics at a mode transition, are reduced by varying the quantization bits of the A/D clock signal based on the dynamic range of residual errors in frequency, to thereby ensure the demodulation performance.

The demodulation performance can also be ensured by operating an ACPE (Advanced Common Phase Error) circuit for an AFC device having many residual frequency errors. In this method, the frequency characteristics of the dual-mode terminal are stabilized and the stability of a demodulator is increased due to a frequency offset. As a result, stable demodulator performance is ensured.

There are three methods of overcoming the problems with use of a single TCXO with respect to a signal having two different RF frequencies in the AFC device of the above dual-mode terminal: (1) using a TCXO which can support both modes; (2) appropriately selecting a quantization level to obtain two linear characteristics; and (3) compensating for residual phase errors in one linear characteristic with respect to the other linear characteristic, in a forward direction in the baseband. That is, the TCXO satisfies a linear characteristic at one mode, and a linear characteristic at the other mode is satisfied by compensating for residual phase errors of digitized data. The above three methods of ensuring the stable characteristics of an AFC device can be applied to a dual-mode terminal according to the costs involved in configuring the receiving terminal.

Figure 3:
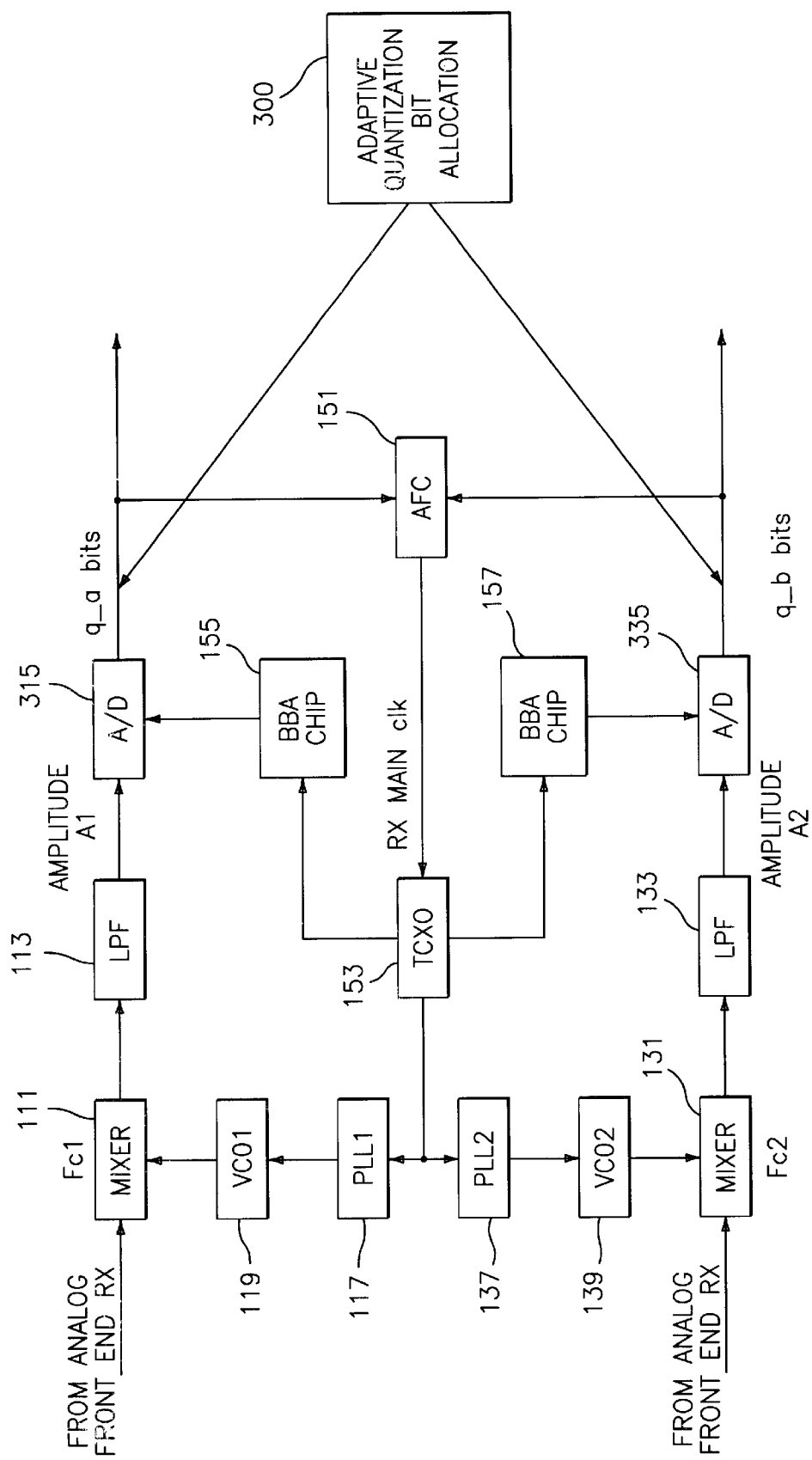
FIG. 3 is a block diagram of a dual-mode AFC device using an adaptive A/D quantization bit assigning method according to an embodiment of the present invention.
Figure 4A:
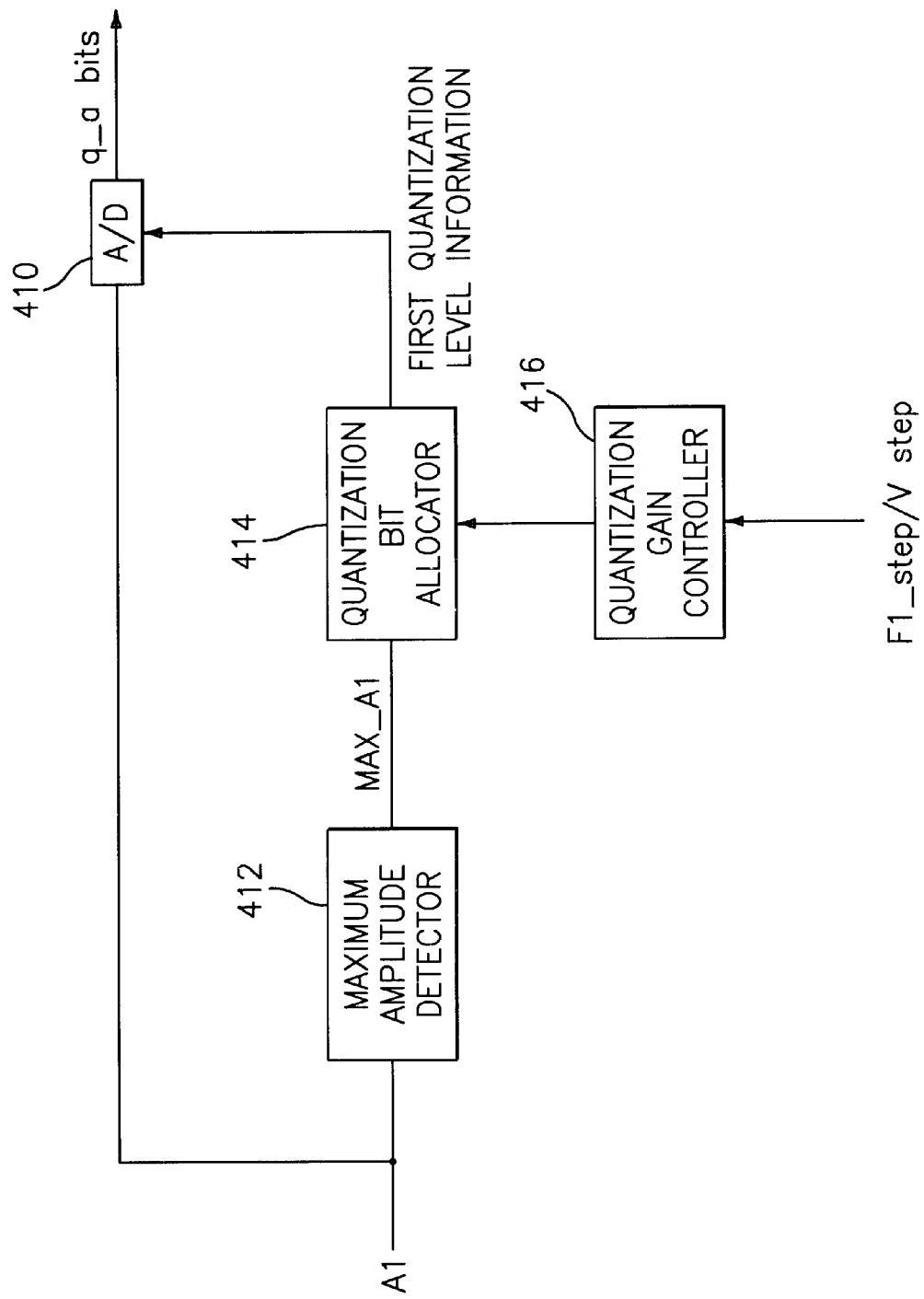
FIGS. 4A and 4B are block diagrams of the A/D units for bit assignment in the dual-mode terminal shown in FIG. 3.
Figure 4B:
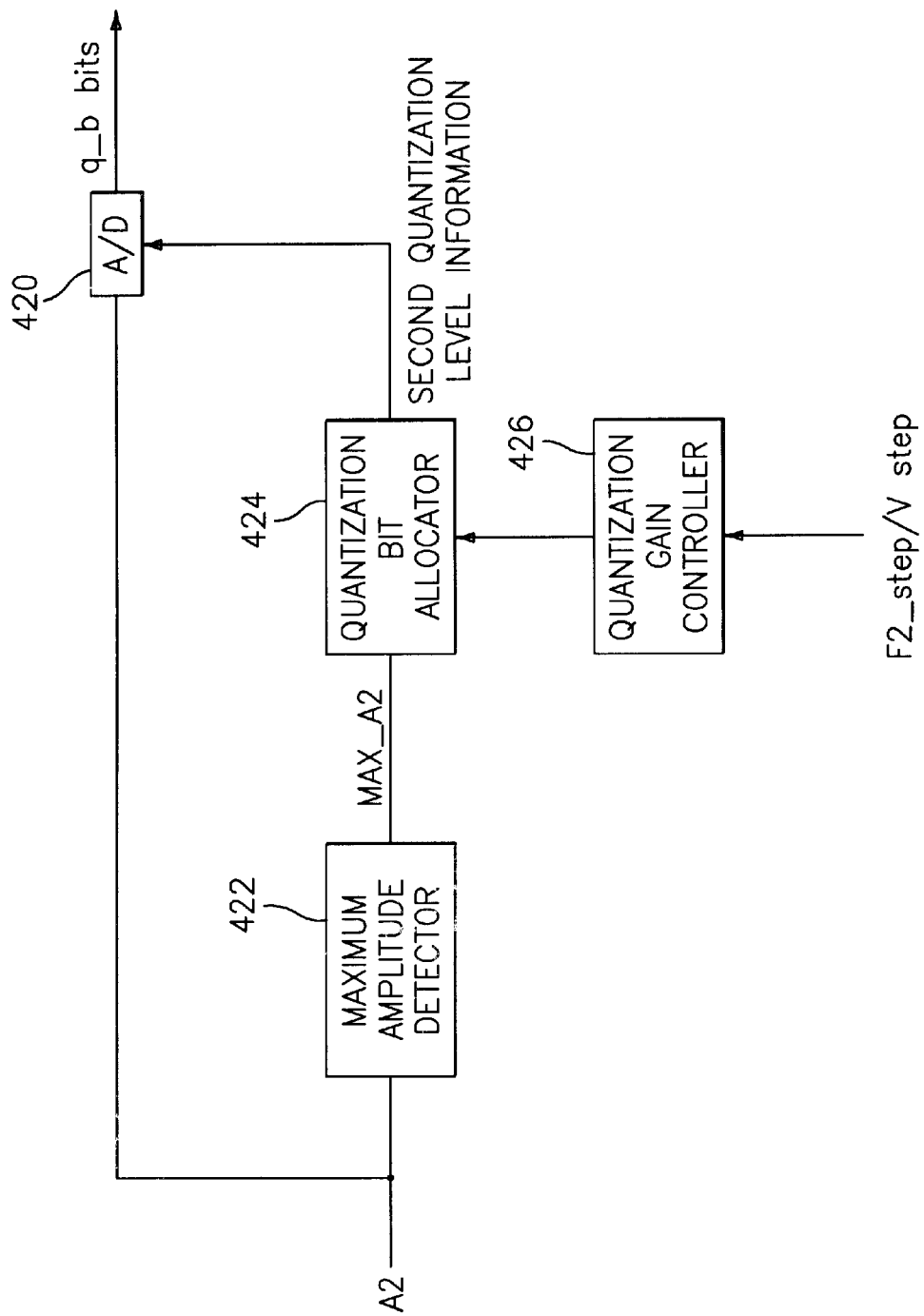

Referring to FIGS. 3, 4A, and 4B, there will be given a description of the operation of an AFC device in a dual-mode terminal according to an embodiment of the present invention. FIG. 3 is a block diagram of the AFC device which improves linear frequency characteristics using an adaptive A/D quantization bit assigning method. FIGS. 4A and 4B are block diagrams of the A/D units 315 and 335, respectively.

Referring to FIG. 3, the mixer 111 mixes the input signal RX with an oscillation frequency received from the oscillator VCO1 119 and outputs the first mixed signal Fc1. The LPF 113 low-pass filters the output of the mixer 111. The output of the LPF 113 is the amplitude A1 of the input signal. The A/D unit 315 converts the output of the LPF 113 to digital data q_a bits. The A/D unit 315 can be configured as shown in FIG. 4A. Referring to FIG. 4A, a maximum amplitude detector 412 detects the maximum amplitude MAX_A1 of the amplitude A1 of the input signal RX received from the LPF 113. A quantization gain controller 416 generates a control signal for controlling quantization gain in response to a first quantization step F1_step/V_step. A quantization bit allocator 414 generates quantization level information according to the maximum amplitude MAX_A1 and the quantization gain control signal received from the quantization gain controller 416. An A/D converter 410 receives the first quantization level information and converts the input signal with the amplitude A1 to digital data q_a bits.

The mixer 131 mixes the input signal RX with an oscillation frequency received from the oscillator VCO2 139 and outputs the second mixed signal Fc2. The LPF 133 low-pass filters the signal received from the mixer 131. The output of the LPF 133 is the amplitude A2 of the input signal. The A/D unit 335 converts the output of the LPF 133 to digital data q_b bits.

The A/D unit 335 can be configured as shown in FIG. 4B. Referring to FIG. 4B, a maximum amplitude detector 422 detects the maximum amplitude MAX_A2 of the amplitude A2 of the input signal RX received from the LPF 133. A quantization gain controller 426 generates a control signal for controlling quantization gain in response to a second quantization step F2_step/V_step. A quantization bit allocator 424 generates second quantization level information according to the maximum amplitude MAX_A2 and the quantization gain control signal received from the quantization gain controller 426. An A/D converter 420 receives the second quantization level information and converts the input signal with the amplitude A2 to digital data q_b bits.

Returning to FIG. 3, the AFC 151 receives the digital data q_a bits and q_b bits from the A/D converters 315 and 335 and generates a signal (RX main clock) for automatically controlling reception frequency. The TCXO 153 multiplies the output of the AFC 151 to generate an intended RF/IF. The PLL1 117 generates a control signal for generating a phase-locked frequency according to the multiplied signal received from the TCXO 153. The oscillator VCO1 119 generates the frequency set under the control of the PLL1 117 and applies the frequency to the mixer 111. The PLL2 137 generates a control signal for generating a phase-locked frequency according to the multiplied signal received from the TCXO 153. The oscillator VCO2 139 generates the frequency set under the control of the PLL2 137 and applies the frequency to the mixer 131. The BBA circuit 155 generates a sampling clock for the A/D converter 115 in response to the output of the TCXO 153. The BBA circuit 157 generates a sampling clock for the A/D unit 335 in response to the output of the TCXO 153.

In order to control the quantization level for the A/D conversion, the slope of a phase detector for the AFC 151 is determined by an input quantization level. That is, input levels of the phase detector should be designed to be different to represent two linear characteristics. The levels of the input signals Fc1 and Fc2 in FIG. 3 should be set to have different linear characteristics so that the AFC 151 can operate with stability. To determine the input levels, the AFC 151 calculates a quantization gain value for A/D conversion by $$K_q = \frac{2^b}{2A} \tag{1}$$

where b represents the quantization level for the A/D conversion and A is the maximum amplitude of the received signal.

Since the quantization level is the slope of the phase detector for the AFC 151, the level slopes of inputs of the TCXO 153 can be controlled by varying quantization bits. The quantization level determines a phase compensation resolution, and as the phase compensation resolution decreases, the sensitivity to phase errors increases.

A quantization conversion rate should be considered in determining the quantization level because a noise margin component should be taken into account in A/D conversion. The quantization rate is the ratio of the quantization level of the A/D unit 315 to that of the A/D converter. The quantization conversion rate is given by $$K_q = \frac{2^b}{2A} * \frac{R}{100} \tag{2}$$

In Eq.2, quantization data qad_a bit and qad_b bit are generated by determining a quantization level so that the slope of the quantization gain shows the two linear characteristics of the TCXO 153.

Therefore, the A/D units 315 and 335 determine the input levels of the received signal having different linear characteristics. The A/D units 315 and 335 determine quantization bits so that the slope of quantization gain shows the two linear characteristics of the TCXO 153, and they convert input signals to digital data. Then, the AFC 151 receives the data q_a bits and qb bits from the A/D units 315 and 335 and rapidly performs phase synchronization. That is, by appropriately selecting the quantization bits in such a way to obtain the two linear characteristics, the AFC 151 can rapidly acquire phase synchronization. The TCXO 153 multiplies the RX main clock received from the AFC 151 and applies the multiplied RX main clock to the PLLs 117 and 137. Reference numeral 300 indicates that the A/D converters 315 and 335 adaptively allocate quantization bits according to the linear characteristic of each mode.

Now, the operation of a dual-mode automatic frequency control device using an ACPE (Advanced Common Phase Error) will be described referring to FIG. 5.

The mixer 111 mixes the input signal RX with an oscillation frequency received from the oscillator 119 and outputs the first mixed signal Fc1. The LPF 113 low-pass filters the output of the mixer 111. The output of the LPF 113 is the amplitude A1 of the input signal. The A/D converter 115 converts the output of the LPF 113 to digital data q_a bits.

The mixer 131 mixes the input signal RX with an oscillation frequency received from the oscillator 139 and outputs the second mixed signal Fc2. The LPF 133 low-pass filters the signal received from the mixer 131. The output of the LPF 133 is the amplitude A2 of the input signal. The A/D converter 135 converts the output of the LPF 133 to digital data q_b bits.

The AFC 151 receives the digital data q_a bits and q_b bits from the A/D converters 115 and 135 and a choice indicator from a terminal control (not shown), and generates a signal (RX main clock) for automatically controlling reception frequency. A first frequency monitor 511 generates an initial loading frequency error from the output of the AFC 151. Specifically, the first frequency monitor 511 loads a frequency error that the AFC 151 has at the previous mode as an initial value and applies it to the TCXO 153. The TCXO 153 multiplies the output of the AFC 151 and the initial loading frequency error to generate an intended RF/IF. The PLL1 117 generates a control signal for generating a phase-locked frequency according to the multiplied signal received from the TCXO 153. The oscillator VCO1 119 generates the frequency set under the control of the PLL1 117 and applies the frequency to the mixer 111. The PLL2 137 generates a control signal for generating a phase-locked frequency according to the multiplied signal received from the TCXO 153. The oscillator VCO2 139 generates the frequency set under the control of the PLL2 137 and applies the frequency to the mixer 131. The BBA circuit 155 generates a sampling clock for the A/D converter 115 in response to the output of the TCXO 153. The BBA circuit 157 generates a sampling clock for the A/D converter 135 in response to the output of the TCXO 153.

A PDS (Phase Density Spectrum) monitor 513 receives PDS information from the TCXO 153 and the second mixed signal Fc2 from the mixer 131 and monitors the PDS. A phase error estimator 515 measures the phase difference between the PDS signal received from the PDS monitor 513 and the data q_a bits from the A/D converter 135. A multiplier 517 multiplies the outputs of the A/D converter 135 and the phase error estimator 515 and re-compensates the digitized data.

Figure 1:
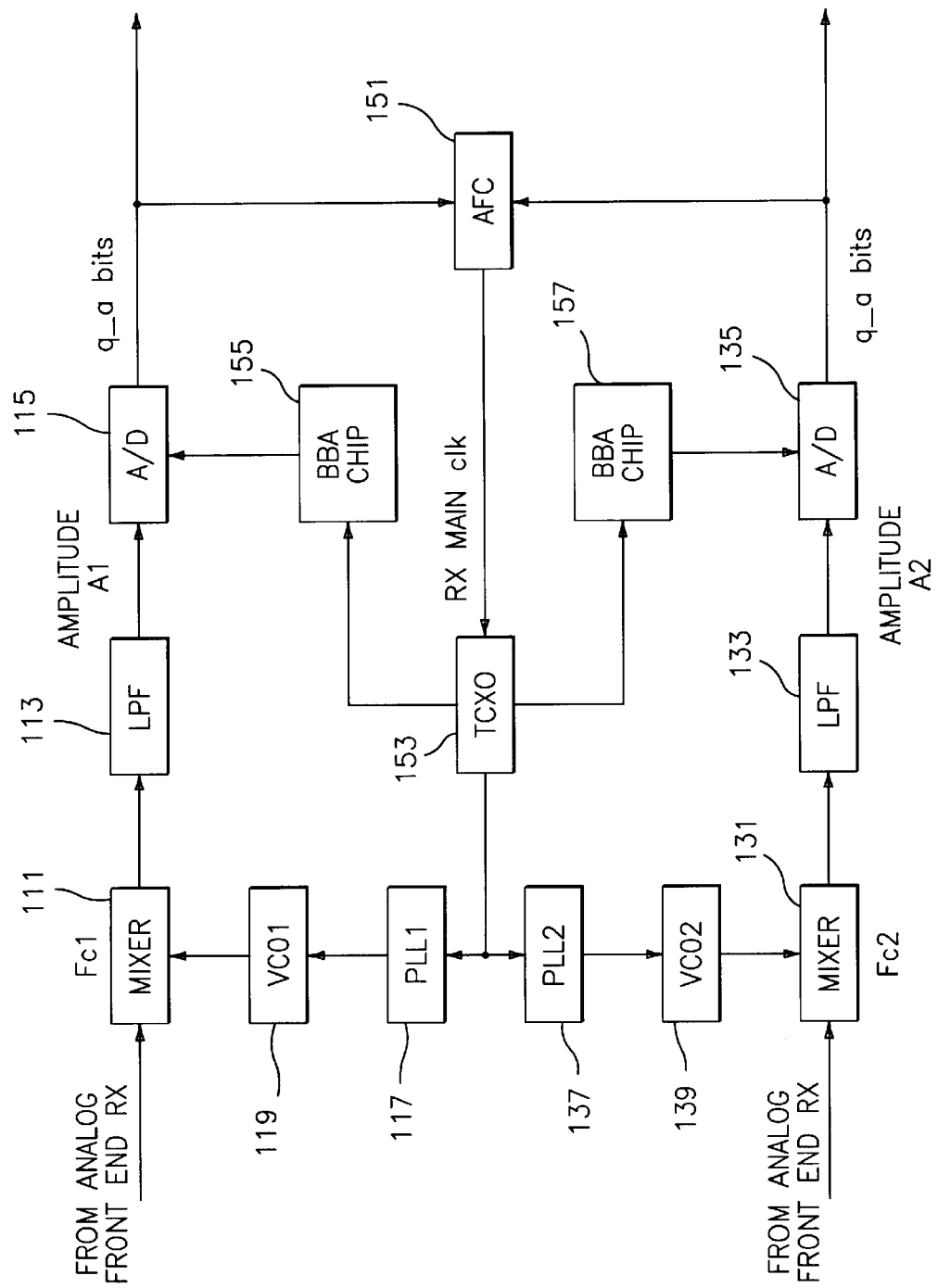
FIG. 1 is a block diagram of an AFC device in a dual-mode terminal according to the prior art.
Figure 2:
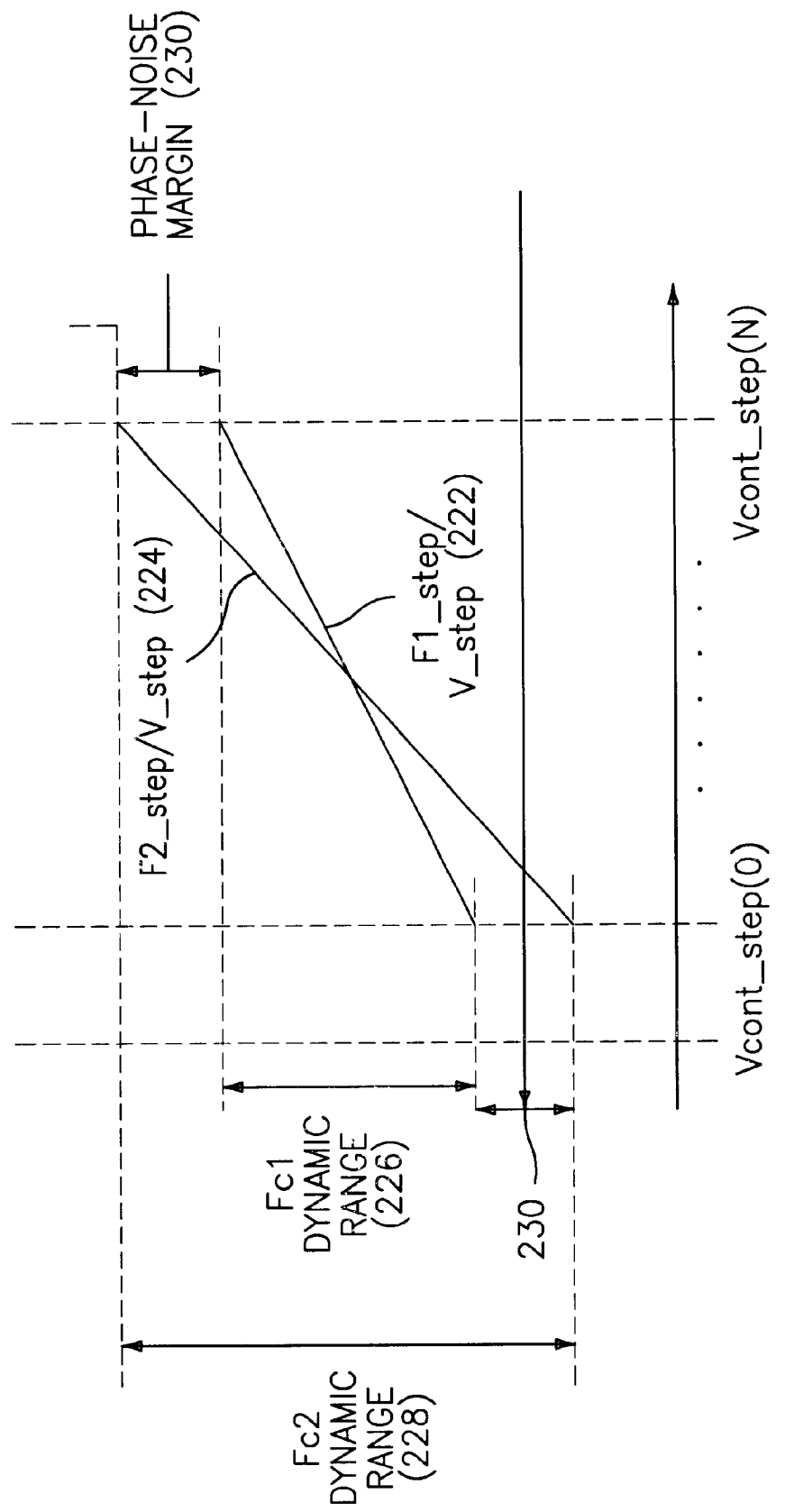
FIG. 2 is a graph illustrating the unequal dynamic ranges in the AFC device of the dual-mode terminal shown in FIG. 1.
Figure 5:
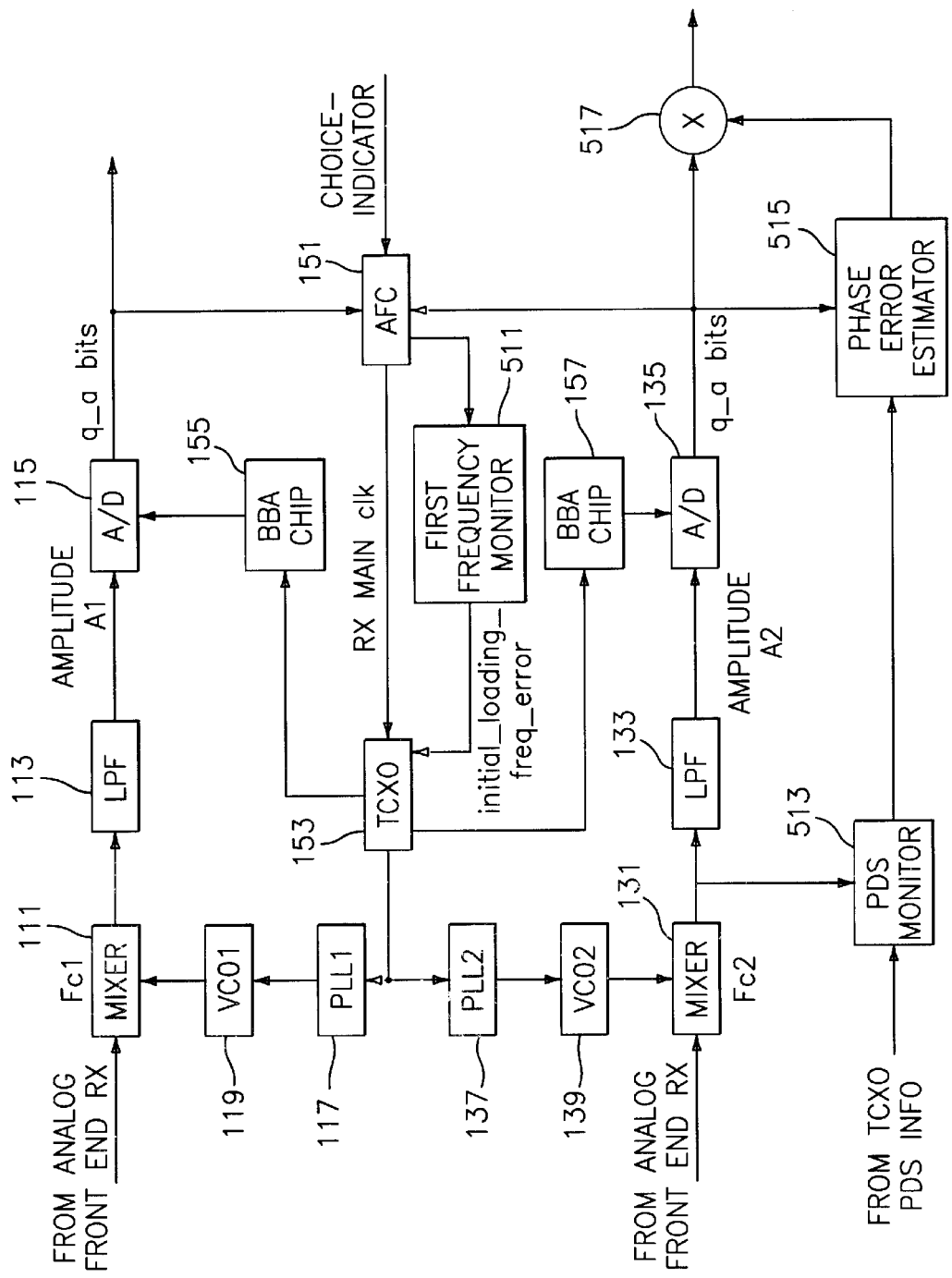
FIG. 5 is a block diagram of a dual-mode AFC device with a forward common error compensating function according to another embodiment of the present invention.

The dual-mode AFC device of FIG. 5 compensates for the noise margin of FIG. 2 at the receiving end using the characteristics of the TCXO 153. To do so, the signal Fc1 is first designed to have a small dynamic range, the PDS monitor 513 monitors the PDS characteristic of the TCXO 153, and the phase error estimator 515 estimates a common phase error (CPE) by analyzing the PDS signal. Simultaneously, the first frequency monitor 511 monitors the tracking error component of Fc1 and loads the corresponding frequency error as the initial loading frequency error when the Fc2 loop operates. Then, when the Fc2 loop starts tracking, the phase error estimator 515 is operated to thereby obtain the CPE value and compensate for the phase error of the AFC 151 based on the CPE value.

More specifically, the initial loading value is set to a stable frequency transition value by the first frequency monitor 511 of Fc1 and then the CPE is obtained.

To obtain the CPE, the PDS characteristic of the TCXO 153 is monitored, an ekda value is determined, and then the PDS of a phase noise is obtained. The PDS is calculated by $$L_{\phi N}(f) = 10^{-c} + \begin{bmatrix} 10^{-a} & : |f| < f1 \\ 10^{(f-f1)\frac{b}{f2-f1}} & : f1 < f \\ 10^{(f+f1)\frac{b}{f2-f1}-a} & : f \leq f1 \end{bmatrix} \quad (3)$$

where f1 and a are the PLL characteristic frequency and gain, respectively, f2 is a frequency with respect to the noise floor of a characteristic curve, b is the slope of the characteristic curve, and c is a noise floor value.

The above PDS characteristic remains as the residual frequency offset of the phase detector, and a phase noise is obtained in the phase error estimator 515 of FIG. 5 and is compensated for at the next end. The phase error is estimated by $$\Theta_{E_L} = \frac{\sum_{i=1}^{N_L} \eta_{cl,l} \cdot \theta_{l,cl,l}}{\sum_{i=1}^{N_L} \eta_{cl,l}} \quad (4)$$

where $N_L$ is an observation period, $n_{cl,\,l}$ is an estimated amplitude value obtained by a channel estimation compensator, and $\theta_{l,\,cl,\,l}$ is the phase of the previous symbol. The influence of linear frequency characteristics on residual phase noise can be compensated for by re-compensating the CPE obtained in the above procedure at the next end of the channel estimated value. Therefore, the AFC can be stabilized.

In accordance with the present invention, when a dual-mode terminal uses one or two AFC devices, the time required for acquiring tracking synchronization in a PLL circuit for a first frequency can be reduced using a test augmentation frequency, which is an integer multiple of a tracking synchronization acquiring residual frequency of a PLL circuit for a second frequency to which the first frequency transitions for reliable synchronization acquisition. Errors with respect to the output dynamic range caused by use of two AFCs are reduced and thus the demodulation performance of a receiver is ensured by varying the quantization bits of the A/D clock based on the dynamic range of residual errors in frequency. The demodulation performance can also be ensured by operating an ACPE circuit for an AFC device having many residual frequency errors. In this method, the frequency characteristics of the dual-mode terminal are stabilized and the stability of a demodulator is increased due to a frequency offset. As a result, stable demodulator performance is ensured.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. An Automatic Frequency Control (AFC) device in a dual-mode terminal, comprising:

a first IF (Intermediate Frequency) generator having a first frequency oscillator, for generating a first IF by mixing a first input signal with a first oscillation frequency;

a first analog-to-digital (A/D) converter for receiving a first quantization step value, allocating quantization bits to obtain a first linear characteristic, and then converting the first IF to first digital data, wherein the first A/D converter comprises a first maximum amplitude detector for detecting the maximum amplitude value of the first IF, a first quantization gain controller for receiving the first quantization step value and generating a first quantization gain control signal, and a first quantization bit allocator for allocating the quantization bits to the maximum amplitude by using the first quantization gain control signal;

a second IF generator having a second frequency oscillator, for generating a second IF by mixing a second input signal with a second oscillation frequency;

a second A/D converter for receiving a second quantization step value, allocating quantization bits to obtain a second linear characteristic, and then converting the second IF to second digital data, wherein the second A/D converter comprises a second maximum amplitude detector for detecting the maximum amplitude value of the second IF, a second quantization gain controller for receiving the second quantization step value and generating a second quantization gain control signal, and a second quantization bit_allocator for allocating the quantization bits to the maximum amplitude by using the second quantization gain control signal;

an automatic frequency controller for receiving one of the first and second digital data by the first and second input signals and automatically controlling the frequency of a main clock based on one of the first and second linear characteristics in accordance with the one of the first and second input signals; and a frequency multiplier for multiplying a signal of said main clock and applying the multiplied clock signal to said first and second frequency oscillators.

2. The AFC device of claim 1, wherein each of the first and second IF generators comprises:

a Phase Locked Loop (PLL) for synchronizing the output of the frequency multiplier with a predetermined frequency in phase;

a mixer for mixing the corresponding input signal with the output of the frequency oscillator; and a filter for filtering an intended IF band from the output of the mixer;

wherein the frequency oscillator generates an internal oscillation frequency by means of the output of the PLL.

3. An Automatic Frequency Control (AFC) device in a dual-mode terminal, comprising:

a first Intermediate Frequency (IF) generator having a first frequency oscillator, for generating a first IF by mixing a first input signal with a first oscillation frequency;

a first analog-to-digital (A/D) converter for converting the first IF to digital data;

a second IF generator having a second frequency oscillator, for generating a second IF by mixing a second input signal with a second oscillation frequency;

a second A/D converter for converting the second IF to digital data;

an automatic frequency controller for receiving the first and second digital data and automatically controlling the frequency of a main clock based on a first and second linear characteristics;

a frequency multiplier for receiving a signal of said main clock and the output of said automatic frequency controller, multiplying the clock signal, and applying the multiplied clock signal to the first and second frequency oscillators;

a Phase Density Spectrum (PDS) monitor for receiving the first IF and PDS information of the multiplier, and generating a PDS monitoring signal;

a phase error estimator for estimating a phase error from the outputs of the second A/D converter and the PDS monitor; and a multiplier for multiplying the phase error by the output of the second A/D converter to thereby correct the phase error.

4. The AFC device of claim 3, wherein each of the first and second IF generators comprises:

a Phase Locked Loop (PLL) for synchronizing the output of the frequency multiplier with a predetermined frequency in phase;

a mixer for mixing the corresponding input signal with the output of the frequency oscillator; and a filter for filtering an intended IF band from the output of the mixer;

wherein the frequency oscillator generates an internal oscillation frequency by means of the output of the PLL.

5. The AFC device of claim 3, wherein the AFC further comprises a first frequency monitor for monitoring the frequency of a signal input to the AFC, loading an input frequency error at the previous mode when the mode is transitioned, and outputting the loaded error to the frequency multiplier.

6. The AFC device of claim 5, wherein the frequency multiplier initially loads the first frequency error and multiplies a clock signal.

7. An automatic frequency controlling method in a dual-mode terminal, comprising the steps of:

generating first and second Intermediate Frequencies (IFs) by mixing first and second input signals with first and second oscillation frequencies;

determining a quantization gain and a transform rate according to the linear characteristics of the first and second IFs and generating first and second digital data;

automatically controlling the frequencies of the first and second digital data and generating a clock signal; and generating the first and second IFs according to the clock signal.

8. An automatic frequency controlling method in a dual-mode terminal, comprising the steps of:

generating first and second Intermediate Frequencies (IFs) by mixing first and second input signals with first and second oscillation frequencies;

generating first and second digital data according to the linear characteristics of the first and second IFs;

monitoring a tracking error component of the first input signal while estimating a phase error, loading the estimated frequency error value as an initial value to be used in generating a clock signal, and generating the clock signal; and generating the first and second oscillation frequencies according to the clock signal, estimating a phase error when an automatic control loop for the second input signal starts tracking, and compensating for the phase error.

* * * * *